United States Patent [19]

Bringmann et al.

[11] Patent Number: 4,673,588

[45] Date of Patent: Jun. 16, 1987

[54] DEVICE FOR COATING A SUBSTRATE BY MEANS OF PLASMA-CVD OR CATHODE SPUTTERING

[75] Inventors: Udo Bringmann; Klaus Drews; Detlef G. Schön, all of Halstenbek, Fed. Rep. of Germany

[73] Assignee: U.S. Philips Corporation, New York, N.Y.

[21] Appl. No.: 694,725

[22] Filed: Jan. 25, 1985

[30] Foreign Application Priority Data

Jan. 28, 1984 [DE] Fed. Rep. of Germany ....... 3402971

[51] Int. Cl.⁴ ............ B05D 3/06

[52] U.S. Cl. ............ 427/41; 118/723; 118/738

[58] Field of Search ............ 118/723, 50.1, 730; 427/39, 41, 79, 101, 117

[56] References Cited

U.S. PATENT DOCUMENTS 3,696,779 10/1972 Murai et al. ............ 118/730
4,142,004 2/1979 Hauser, Jr. et al. ............ 427/39
4,399,016 8/1983 Tsukada et al. ............ 118/723 X
4,461,237 7/1984 Hinkel et al. ............ 118/50.1
4,478,875 10/1984 Pachonik et al. ............ 427/41
4,512,283 4/1985 Bonifield et al. ............ 118/723
4,513,021 4/1985 Purdes et al. ............ 118/723

FOREIGN PATENT DOCUMENTS 56-49521 5/1981 Japan ............ 427/39

*Primary Examiner*—Richard Bueker
*Attorney, Agent, or Firm*—Norman N. Spain

[57] ABSTRACT

A device for covering a substrate by means of both plasma chemical vapor deposition and by high-frequency cathode sputtering which, as a result of easily exchangeable individual devices to introduce gaseous substances into the reaction space as well as easily exchangeable individual devices for influencing the flow of the process gases within the reaction space, results in a very good uniformity of the layer thickness of the produced layers even when the operation has to be carried out at higher gas pressures and hence higher flow rates.

3 Claims, 3 Drawing Figures

55 1 3 57 53 31 33 11 41 31 5 35 13 15 7 17 9 29 23 27 25 25 39 19 21 43 37

DEVICE FOR COATING A SUBSTRATE BY MEANS OF PLASMA-CVD OR CATHODE SPUTTERING

BACKGROUND OF THE INVENTION

The invention relates to a device for coating a substrate by means of plasma-chemical vapour deposition or cathode sputtering said device having an evacuated chamber, a first and a second electrode, means for introducing gaseous substances into the chamber, and means for applying an RF-voltage to the first and/or the second electrode to produce a plasma.

Such a device may be used, for example, for coating a substrate with a layer of polymerized material by a glow discharge polymerization or also as a device for a cathode sputtering process.

Glow discharge polymerization is a known technique for depositing a layer of an organic or inorganic polymer. There are two fundamental or different types of methods.

In the first type the surface of an existing material is polymerized and cured by being exposed to a glow discharge which is produced in air or in an inert gas. Surface molecules are activated by the glow discharge and form compounds and cross-linked compounds with adjacent molecules. Since the activaton is limited to an area in the proximity of the surface, the mass of the material remains unchanged. In the second type of method a layer of polymerized material is deposited on a substrate by a glow discharge that is produced in a monomeric gas adjoining the substrate. Reactive species and types of material, respectively, which are produced in the glow discharge are deposited on the substrate and form a polymerized layer. The polymerization extends through the whole deposited material. The present device relates to the performance of polymerization methods of the second type.

In a typical polymerization situation of the second type the glow discharge is produced by means of an electric potential which is applied to two electrodes which are provided in a space which comprises a monomeric gas at a pressure less than atmospheric pressure. A glow discharge occurs and only a very small current flows through the gas, when the potential between the electrodes does not exceed a threshold value, which value is sufficient to produce ionization of the gas or disruptive discharge.

It is known that discharge potential depends on the composition of the gas, the pressure of the system and the spacing between the electrodes. After the discharge has occurred, the gas is conductive and a stable plasma can be maintained over a wide current range. Once a plasma has been produced, it can be maintained by a potential which is smaller than the breakdown potential and the breakdown voltage, respectively. The accurate composition of the discharge plasma is not known. It is assumed that it consists of electrons, ions, free radicals and other reactive species.

Cathode sputtering is also a known method for forming a layer of material on a substrate.

In cathode sputtering the material is removed from the surface of a target plate by ion bombardment and is deposited on the substrate. When the material to be sputtered is electrically conductive, a direct voltage potential is used. When the material to be sputtered is not electrically conductive or is an insulator, it is preferred to use a high frequency voltage to avoid the formation of surface charges on the insulator and the loss of accelerating voltage resulting therefrom. In known methods of depositing a layer of a polymer by cathode sputtering, first the polymer itself is prepared in the form of a sheet, respectively, or a powder target. A target electrode is manufactured by arranging the target in contact with a conductive surface. The target electrode and the target, respectively, and a seccond electrode are provided in an evacuated space which may be filled with an ionizable inert gas, for example argon, at a suitable pressure. A polymeric layer can be formed on a substrate by a glow discharge which is produced by applying a suitable voltage between the target and the second electrode.

SUMMARY OF THE INVENTION

It is an object of the invention to provide a device of the kind described in the opening paragraph which may be used both for the deposition of layers by means of a plasma-chemical vapour deposition process and also by means of a cathode sputtering process i.e. an RF cathode sputtering process which allows a great variability of the process, which hence can easily be converted into different desired processes, which device can easily be dismantled, which can easily be cleaned, and which ensures a particularly good homogeneity of the thickness of the layers to be produced.

According to the invention this object is achieved by a device having an evacuatable chamber provided with a first electrode which is fixed in the axial direction and has a central aperture (annular electrode) and a counter electrode (sheet electrode) both electrodes are arranged centrally in the evacuatable space, the annular electrode being provided on a bipartite insulator block having an upper first portion adjoining the annular electrode, and having a central aperture corresponding to the central aperture of the annular electrode and having a second portion immediately adjoining the first portion and bearing on the base plate of the evacuatable chamber over a connection flange of the vacuum pump required for the evacuation of the space, said second portion leaving the connection flange free.

According to an advantageous embodiment of the invention the first portion of the insulator block is provided at least one further aperture opening into the central aperture and extending approximately perpendicularly to the central aperture. By such means the advantage is obtained that the device can very rapidly be converted for use with various devices for introducing gaseous substances.

A particularly good adaptability of the process is achieved by making use of two different principals for introducing gaseous substances. According to one advantageous further embodiment of the invention the device for introducing gaseous substances into the evacuatable chamber is a multichamber annular distributor in which reaction gases can be introduced from without and can freely reach the reaction space in the chamber. The device for introducing gaseous substances into the evacuatable chamber may also be formed by gas pipes which are introduced into the evacuatable chamber in a vacuum-tight manner and open into the further aperture opening into the central aperture of the insulator block and extending at right angles to the central aperture.

With the introduction of the gaseous substances via the multichamber annular distributor the advantage is achieved that a very good homogenization of the gas flow is ensured, which leads to an extraordinary good uniformity of the layer thickness of the produced layers. With this gas flow and the possibility of adjusting the height of the multichamber annular distributor in such manner that the distance between the annular electrode and the gas outlet aperture in the multichamber annular distributor is kept as small as possible the further advantage is achieved that the pollution of the reactor remains very low. This type of gas flow is particularly suitable when the process is to be carried out at higher gas pressures and hence higher flow rates, so always when a depletion of the above species as a result of an increased deposition rate occurs and the adjusting layer thickness gradient should be avoided.

With the gas flow via the inlet of the gaseous substances immediately into the central aperture in the bipartite insulator block below the annular electrode the advantage is achieved that very homogeneous layers can be reached in case no depletion effects of the activated species radially outwards occur.

According to further advantageous modified embodiments of the invention turntables are provided on one or on both electrodes, on the annular electrode and/or on the oppositely located sheet electrode, in such manner as to be rotatable by a gear wheel which is rigidly connected to the electrode(s) and which can be driven via an electrically insulating intermediate member and at least one rotary bearing introduced into the evacuatable chamber in a vacuum-tight manner from without.

According to further advantageous modified embodiments of the invention a temperature moderating labyrinth system is provided both in the annular electrode and in the sheet electrode and is connected via a detectable connection flange to a tempering medium circuit. Herewith the advantage is achieved that the deposition rate can be influenced via the temperature.

According to further advantageous modified embodiments of the invention resistance-heated plates can be provided as an additional heating both on the annular electrode and on the sheet electrode, the heating current transmission occurring by sliding ring contacts. Herewith the advantage is achieved that processes can also be carried out in which a given minimum substrate temperature is required.

When the device according to the invention is to be used for a high frequency cathode sputtering process, according to an advantageous further embodiment of the invention the electrodes (annular and sheet electrodes) can be provided with screenings which are connected to earth potential. The performance of a plasma-chemical vapour deposition process by means of the device according to the invention will be described with reference to an example for the manufacture of a plasma-polymerized layer on a substrate, the method being carried out so that at least one substrate to be coated is laid on one of the electrodes (sheet electrode or annular electrode) in the evacuatable chamber and the starting gas consisting of at least one monomeric process gas from which a layer of plasma-polymerized material can be deposited on the substrate (s) by high frequency excitation of the gas phase molecules, and optionally at least one inert carrier gas is introduced into the chamber via the device for leading-in gaseous substances. According to an advantageous modified embodiment of the method according to the invention the layer of plasma-polymerized material is formed so that as a monomeric process gas at least one such gas is supplied from which polymerized Si:N:O:C:H-containing compounds can be formed. Hexamethyl disilazane is preferably supplied as a monomeric process gas.

DETAILED DESCRIPTION OF THE INVENTION

Figure 1:
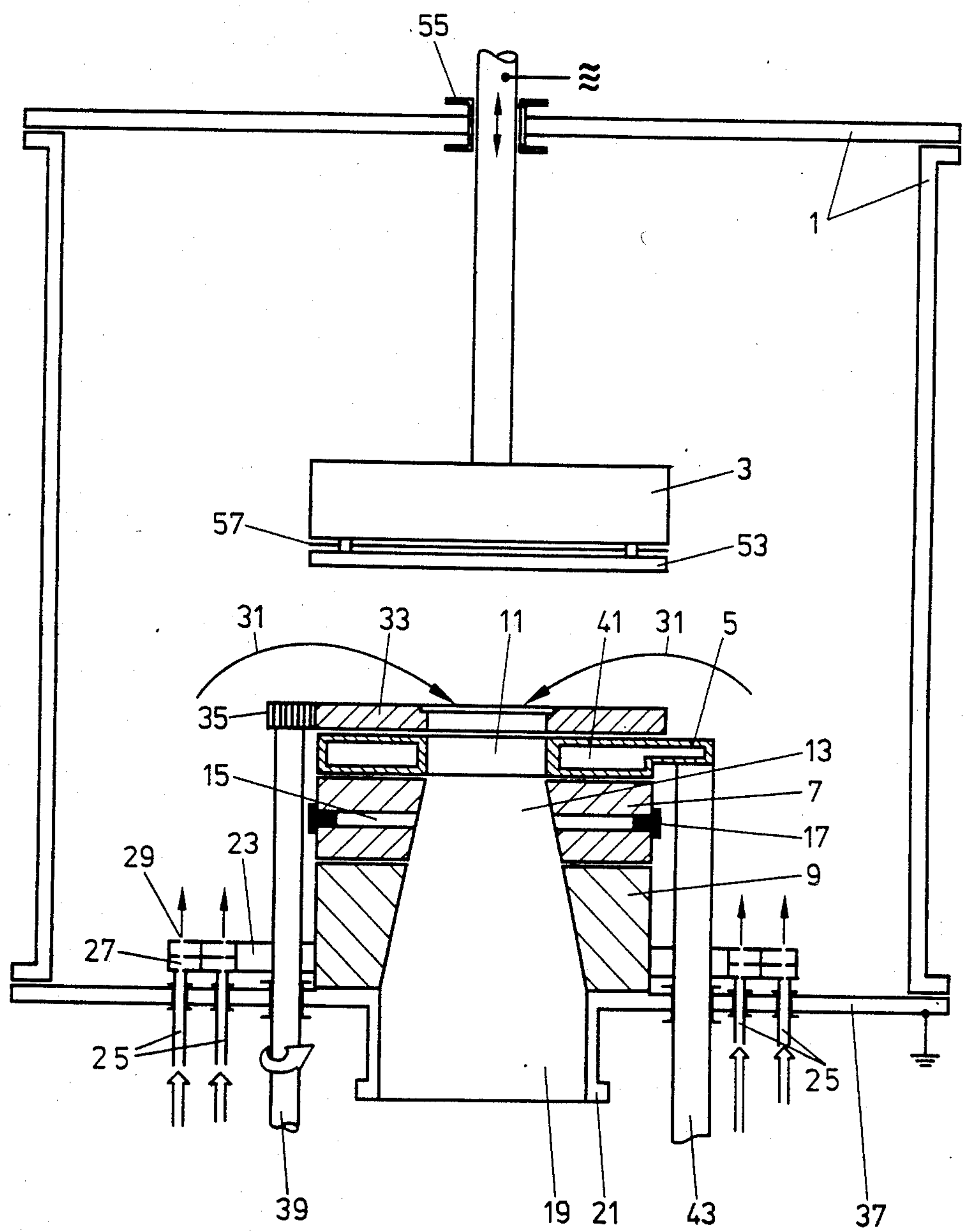
FIG. 1 is a sectional view of a first embodiment of the invention.

Embodiments of the invention will be described in greater detail with reference to the drawing which:

FIG. 1 shows a device for coating a substrate having an evacuatable chamber 1 with a sheet electrode 3 and an annular electrode 5 which bears on a bipartite insulator block. The annular electrode 5 has a central aperture 11. The insulator block arranged below the annular electrode has a first upper portion 7 adjoining the annular electrode and comprising a central aperture 13 which preferably widens conically and whose diameter adjoining the annular electrode 5 corresponds to the diameter of the central aperture 11 in the annular electrode 5. The part 7 of the insulator block comprises a further aperture 15 which opens into the central aperture 13, extends approximately at right angles thereto, and can be closed by means of a stopper 17. The portion 7 of the insulator block is present on a second portion 9 of the insulator block which likewise comprises a central aperture 19 which preferably widens conically and whose diameter on the side of the first portion of the insulator block corresponds to the diameter of the central aperture in the first portion 7 of the insulator block at that area. Via the duct formed from the central apertures 11, 13 and 19, gases can be drawn from the reaction space via a vacuum pump (not shown) connected to a pump nozzle 21. Process gases are supplied to the evacuatable chamber 1 via a multi-chamber annular distributor 23; the gases emanate freely from the multichamber annular distributor 23 in the direction of the arrows into the reaction space. The multichamber annular distributor 23 comprises at least one connection 25 for the inlet of process gases (four connection nozzles are shown in the drawing) from which the process gases enter chambers 27 present above the connections 25 and communicating with each other, via apertures, from which chambers the processes gases enter the reaction space via a plurality of smaller apertures 29 and can be drawn again out of the reaction space via the system of apertures 11, 13 and 19 in the direction of the arrows 31.

The uniformly distributed gases are hence drawn off centrally via the electrode surface of the annular electrode 5. A turntable 33 is provided on the annular electrode 5 and can be rotated by a gear wheel 35 which is rigidly connected to the annular electrode and which is engaged by a pinion not shown, which pinion can be driven via an electrically insulating rack-compensating intermediate member and a rotary bearing 39 which rotary-bearing can be actuated from without and is passed in a vacuum-tight manner from without through the bottom plate 37 of the chamber 1.

Construction of the turntable present on the annular electrode: the gear wheel 35 with $z=360$ and $M=1$ ($z$=teeth; $m$=module) provided with an extension (not shown) of a diameter of $160\times20$ and a central aperture having a diameter of 150 mm, is provided on the annular electrode 5 by simple mounting. The driving is carried out via a pinion mounted laterally of the electrode with z=20 which is driven from without via the rotary bearing 39. The maximum speed is approximately 2 rpm. The annular electrode 5 has a temperature moderating labyrinth 41 which can be connected via a lateral rapidly detachable connection flange 43 to a tempering medium circuit. The connection flange 43 simultaneously serves as a connection to the RF-generator system and is led out in a vacuum-tight and electrically insulated manner from the evacuatable chamber 1 via the base plate 37.

In order to ensure a good thermal coupling to the tempered annular electrode 5, bronze and hard chromium are used as material combinations of the sliding surfaces. Silicon oil improves the thermal contact and the sliding properties. A turntable (not shown) may also be provided on the sheet electrode 4. Structurally the turntable of the upper plate electrode 3 is constructed as that of the lower annular electrode 5.

As a result of the suspending arrangement of the sheet electrode 3, the bearing must be constructed so as to be form-coupled; for that purpose, a track ring which is conical on the side remote from the process may be mounted on the circumference of the suspended sheet. This ring may support track roller racks, radially as well as axially, that are mounted on the turntable and position the plane face of the turntable against the surface of the sheet electrodes 3, so that on one hand a good thermal conductivity takes place and on the other hand the rotation is not hampered. The material combination of the bearing surfaces in this case also is bronze on hard chromium, and silicon oil may also be used to improve the sliding properties and the thermal conductivity.

Figure 2:
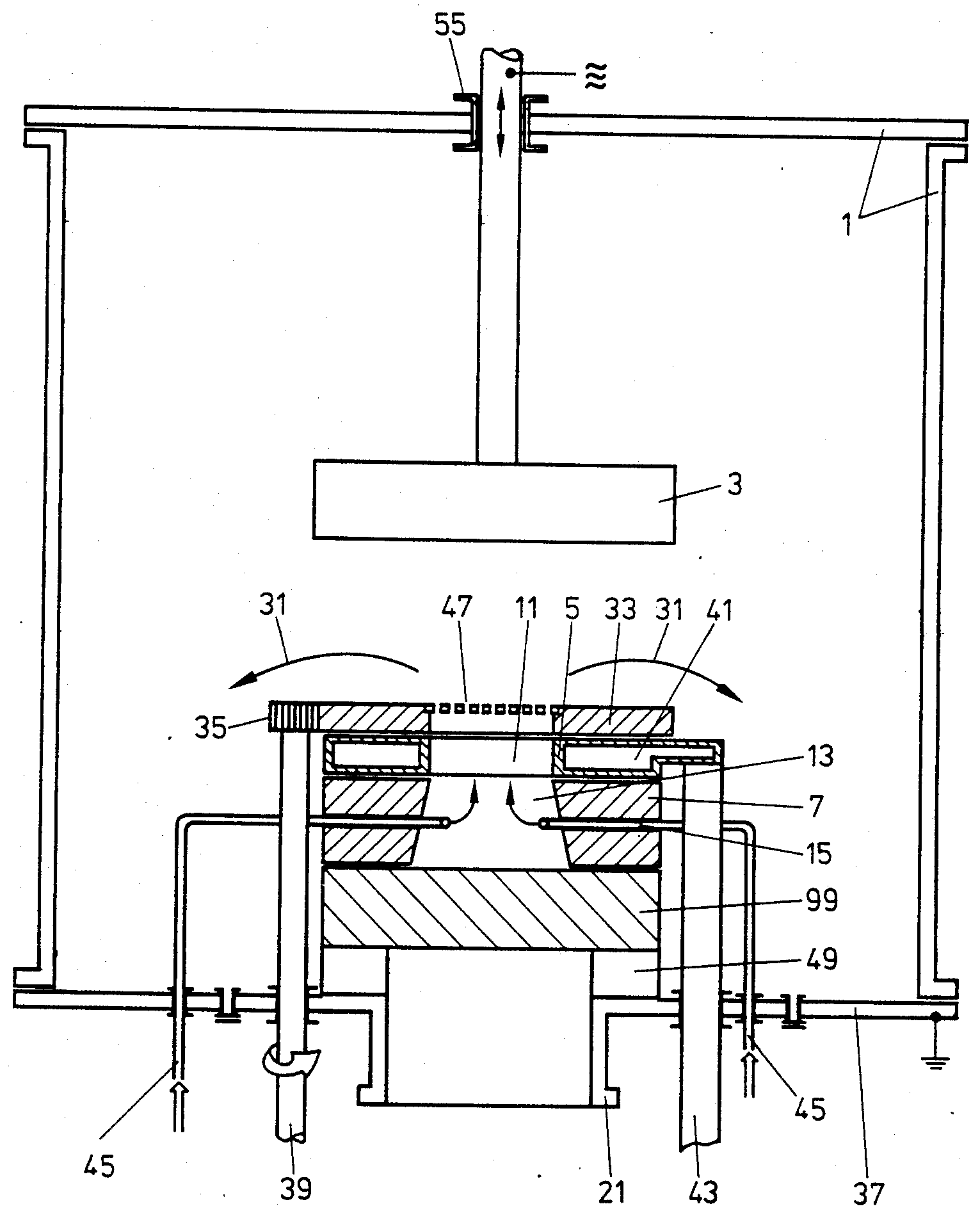
FIG. 2 is a sectional view of a second embodiment of the invention.

FIG. 2 shows a modified embodiment of the device according to the invention in which process gases are supplied to the evacuated space 1 via gas inlets 45 led through the base plate 37 of the evacuated chamber 1 in a vacuum-tight manner and opening into the further aperture 15 which opens into the central aperture 13 of the portion 7 of the insulator block from which the stoppers 17 have been removed. For the construction of the FIG. 2 device the second part 99 of the insulator block is a solid plate and the area of the central aperture 11 in the annular electrode 5 adjoining the reaction space is covered with a perforated cover plate 47, for example of copper sheet. The reaction gases which have reached the reaction space via the central aperture 13 in the portion 7 of the insulator block and the perforated cover plate 47 in this embodiment are not removed via the apertures 11, 13 and 19, but they are removed by the vacuum pump on the outside of the insulator block 99 via slots 49 provided laterally therein and the additive cross-section of which is larger than the cross-section of the nozzle 21 of the vacuum pump.

The severing of the insulator block into the portions 7, 9 and 99 thus enables two forms of operation of the device: according to FIG. 1 the central aperture in the insulator block is free so that the pumping system removes the gases introduced via the annular gas distributor from the reaction space through said aperture.

According to FIG. 2 the central suction is interrupted. The process gases flow through the available apertures in the upper insulator portion and reach the reaction space centrally through the perforated cover sheet. They are removed by the pumping system via the electrode from the inside to the outside and through laterally provided slots in the lower exchanged insulator portion in the form of a plate without a central aperture.

The arrangement of substrates may occur on both electrodes. Both electrodes can be switched electrically at RF potential or earth potential. Positioning may be done by simply providing them on the annular electrode, while for the positioning on the upper sheet electrode a substrate holder plate is required. Both electrodes may be provided with turntables which permit a good layer thickness homogeneity.

Under deposition conditions which require a temperature up to 500° C. the further additional element may be a heating plate provided both on the lower annular electrode 5 and also on the upper sheet electrode 3 in the form of a resistance-heated plate (53). The heating current transmission occurs via screened sliding ring contacts.

Radiation sheets 57 are advantageously provided between the electrode(s) 3 and the resistance-heated plates 53 for thermal separation. In this case substrates are placed on the resistance-heated plates.

While using the device according to the invention as shown in FIG. 1 a polymer layer manufactured from hexamethyldisilazane (HMDSN) was deposited on substrates which with a layer thickness of $d=0.6\ \mu m$ reaches a radial layer thickness homogeneity of $\pm 1\%$ with an envisaged length of $1=60$ mm; a radial layer thickness homogeneity of $\pm 5\%$ was achieved with an envisaged length of $1=140$ mm.

The following process parameters were used: the substrates were provided on the upper sheet electrode 3; the electrode spacing H between the sheet electrode 3 and the annular electrode 5 was adjusted at $H=50$ mm. Substrate tempersture $T_S=35°$ C.; monomer gas pressure $P_{HMDSN}=2$ Pa; carrier gas pressure $P_{argon}=3$ Pa; output surface density $N=0.5\ W/cm^2$; deposition rate $d=40$ nm/min.

This example shows that with the present device a particularly good uniformity of the layer thickness of the produced layers can be achieved. In spite of an increased deposition rate at which usually a layer thickness gradient occurs due to the depletion of the excited species, the above-given good values for the layer thickness homogeneity were achieved.

Figure 3:
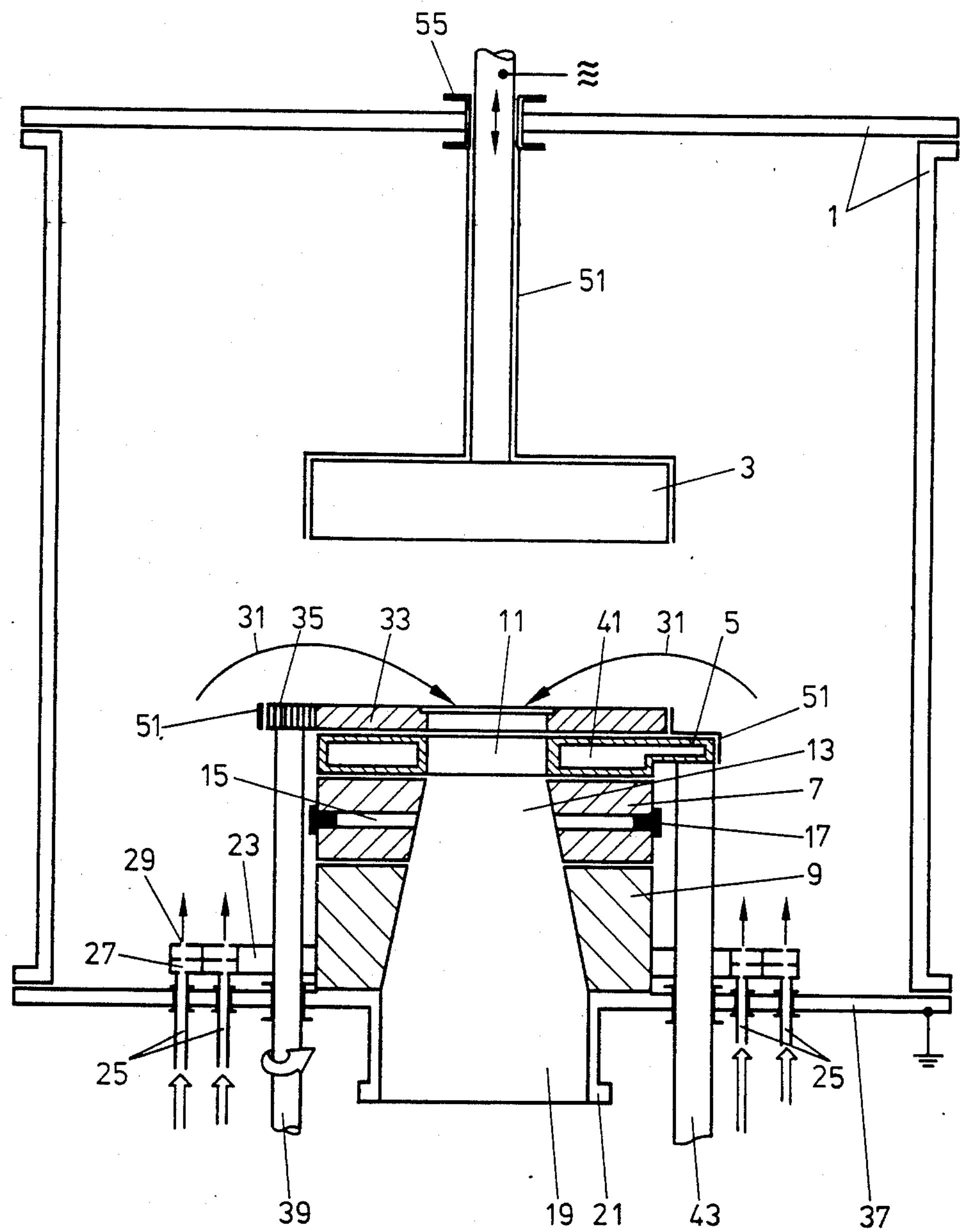
FIG. 3 is a sectional view of a device of the invention used as an Rf cathode sputtering device.

FIG. 3 shows a device according to the invention for use as an RF-cathode sputtering device. For this purpose it is necessary to screen the electrodes 3, 5 from the inner wall of the evacuated chamber 1 by two screening rings 51 which are at earth potential.

What is claimed is:

1. A method of forming a polymeric coating on a substrate by means of a plasma chemical vapor deposition, said method comprising:

(a) positioning a substrate on a surface of a first annular electrode provided with an aperture extending along its central axis and axially fixed in a evacuatable chamber provided with a second counter sheet electrode spaced from and opposing said first electrode, and further provided with a bipartite insulator block having an upper first portion adjoining said first electrode and provided with a central aperture corresponding to the central aperture of said first electrode and having a second portion immediately adjoining said first portion bearing on the base of said evacuatable chamber and positioned over a conduit means for conducting gaseous material from said chamber to a vacuum pump means;

(b) evacuating gaseous material from said evacuatable chamber by means of said vacuum pump means while providing a flow of a plasma polymerizable monomeric gas into said chamber and into said aperture provided in said first annular electrode and;

(c) forming a glow discharge on said substrate while rotating said substrate thereby causing said polymerizable gas to be polymerized and form an essentially uniform coating on said substrate.

2. The method of claim 1 wherein the polymerizable monomeric gas comprises a gas containing the monomeric unit Si:N:O:C:H.

3. The method of claim 1 wherein the polymerizable gas is hexamethyldisilazane.

* * * * *